(12) United States Patent
Hunt et al.

(10) Patent No.: US 9,088,080 B2
(45) Date of Patent: Jul. 21, 2015

(54) FRAME GROUND CONNECTION

(71) Applicant: THOMSON LICENSING, Issy de Moulineaux (FR)

(72) Inventors: Mickey Jay Hunt, Camby, IN (US); Randy Wayne Craig, Fishers, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 31 days.

(21) Appl. No.: 13/865,270

(22) Filed: Apr. 18, 2013

(65) Prior Publication Data

US 2014/0315422 A1 Oct. 23, 2014

(51) Int. Cl.
| | |
|---|---|
| H01R 13/641 | (2006.01) |
| H01R 13/717 | (2006.01) |
| H01R 4/64 | (2006.01) |
| H01R 13/24 | (2006.01) |
| H01R 13/642 | (2006.01) |
| H05K 7/14 | (2006.01) |

(52) U.S. Cl.
CPC .............. *H01R 4/64* (2013.01); *H01R 13/2442* (2013.01); *H01R 13/642* (2013.01); *H05K 7/142* (2013.01)

(58) Field of Classification Search
CPC .... H01R 13/465; H01R 13/641; H01R 13/64; H01R 13/717; H01R 13/7175
USPC .................................................. 439/488, 910
See application file for complete search history.

(56) References Cited

U.S. PATENT DOCUMENTS

| | | | | |
|---|---|---|---|---|
| 6,575,775 | B2 * | 6/2003 | Hasegawa et al. | 439/188 |
| 6,835,092 | B2 * | 12/2004 | Wan et al. | 439/541.5 |
| 7,645,166 | B1 * | 1/2010 | Wang | 439/630 |
| 2005/0064762 | A1 * | 3/2005 | Yu | 439/607 |
| 2009/0059485 | A1 | 3/2009 | Lynch et al. | |

* cited by examiner

*Primary Examiner* — Gary Paumen
(74) *Attorney, Agent, or Firm* — Robert D. Shedd; Richard LaPeruta (57) ABSTRACT

An electronic device including a frame having a front frame wall and a front panel assembly. The front frame wall is grounded and is parallel to the front panel assembly (FPA). The front panel assembly has a printed circuit board (PCB) on an interior side of it and PCB includes a ground contact. A detachable ground clip is attached to the front frame wall and has a protruding flexible arm that is configured to engage the ground contact of the PCB when the FPA is positioned for assembly. The central contact portion contacts or engages the ground contact on the PCB, and includes a visual indicator means integrated into the distal end and the front frame wall such that an observer looking at the interior side of the front frame wall can visually confirmed the central contact engagement with the ground contact of the printed circuit board.

8 Claims, 7 Drawing Sheets

FRAME GROUND CONNECTION

BACKGROUND

1. Technical Field

The present principles relate to ground connections. More particularly, it relates a ground connection between a front frame wall or chassis of an electronic device and one or more printed circuit boards within a front panel assembly attached to the front frame wall or chassis of the device.

2. Related Art

During the assembly of an electronic device, such as, for example a set top box, there is a need to carry or connect the ground from a frame wall or chassis to a front panel assembly (FPA) or graphic bezel assembly that includes printed circuit boards (PCB) and the like.

In order to connect or ground a PCB of the FPA to the frame wall or chassis of the electronic device, it is common to use a mechanical device having one or more parts configured to engage the PCB ground contact when the device is completely assembled.

One of the many drawbacks associated with known ground connectors is that once the frame and device is assembled, there is no way for the assembler to confirm that the ground connection between the frame and the respective PCB has been made, and more importantly, has been made in a manner which complies with the assembly and electronic standards for the respective device.

SUMMARY

According to an implementation, the ground connection for an electronic device includes a ground connector clip connected to a front frame wall of the electronic device and having a protruding flexible arm configured to engage a ground contact of a printed circuit board that is part of a front panel assembly, and visual indicator means integrated into the ground connector clip and the front frame wall. The visual indicator is configured to provide a visual indication of a proper ground connection between the protruding flexible arm and the ground contact of the printed circuit board when the front panel assembly is finally aligned with the front frame wall for assembly.

According to another implementation, the ground connection for the electronic device is integrated into a set top box which includes a frame having a front frame wall and a front panel assembly. The front panel assembly has a printed circuit board on an interior side of the same which includes a ground contact. A detachable ground clip is attached to the front frame and has a protruding flexible arm that contacts the ground contact of the printed circuit board when the front wall assembly is finally positioned relative to the front panel assembly.

According to one implementation, the flexible arm of the ground clip includes an attachment base from which the flexible arm extends, a proximal portion extending from the attachment base, a central contact portion of the flexible arm connected to the proximal portion, and a visual indicator integrated into the detachable ground clip and the front frame wall. The central contact portion includes that portion of the flexible arm that contacts the ground contact on the printed circuit board.

The visual indicator is configured to provide a visual indication of a proper ground connection between the central contact portion and the ground contact of the printed circuit board when the front panel assembly is aligned with the front frame wall for assembly.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which.

DETAILED DESCRIPTION

The present principles are directed to ground connections between the front frame wall or chassis of an electronic device and one or more printed circuit boards (PCBs) which are part of the front panel assembly (FPA) or graphic bezel assembly. In one preferred implementation the electronic device is a set top box (STB).

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

In the claims hereof, any element expressed as a means for performing a specified function is intended to encompass any way of performing that function including, for example a combination of elements that performs that function. The present principles as defined by such claims reside in the fact that the functionalities provided by the various recited means are combined and brought together in the manner which the claims call for. It is thus regarded that any means that can provide those functionalities are equivalent to those shown herein.

The present disclosure may be understood more readily by reference to the following detailed description of the disclosure taken in connection with the accompanying drawing figures, which form a part of this disclosure. It is to be understood that this disclosure is not limited to the specific devices, methods, conditions or parameters described and/or shown herein, and that the terminology used herein is for the purpose of describing particular embodiments by way of example only and is not intended to be limiting of the claimed disclosure. Also, as used in the specification and including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment. It is also understood that all spatial references, such as, for example, horizontal, vertical, top, upper, lower, bottom, left and right, are for illustrative purposes only and can be varied within the scope of the disclosure.

Figure 1:
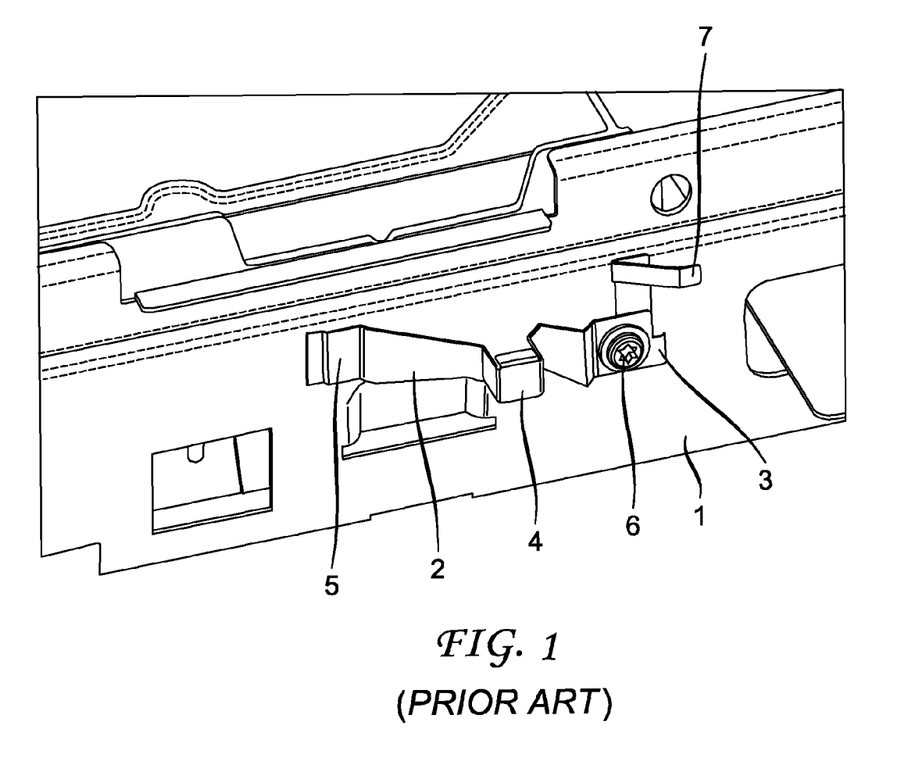
FIG. 1 is perspective view of a prior art frame to FPA ground connection device.

Referring to FIG. 1 there is shown a ground connector 2 of the prior art affixed the front frame wall 1 of an electronic device, such as, for example a set top box. The ground connector 2 has an attachment base 3 which is connected to the front frame wall 1 by an attachment screw 6. A contact point 4 is configured to engage a ground contact on a printed circuit board (PCB). A distal end 5 of the connector 2 is retained in opening in frame wall 1. A spring 7 is to provide a ground to the reset PCB.

In accordance with ground connection requirements of the front frame wall with the front panel assembly (FPA) or bezel graphic assembly, it is important that the ground connection not apply excessive force to the FPA or bezel graphic assembly. In this prior art example of FIG. 1, the ground connection is a "blind" connection (i.e., the assembler cannot visually confirm the connection between the contact point 4 and the ground contact of the corresponding PCB once the front frame wall is engaged with the front panel or bezel graphic assembly.

Figure 2A:
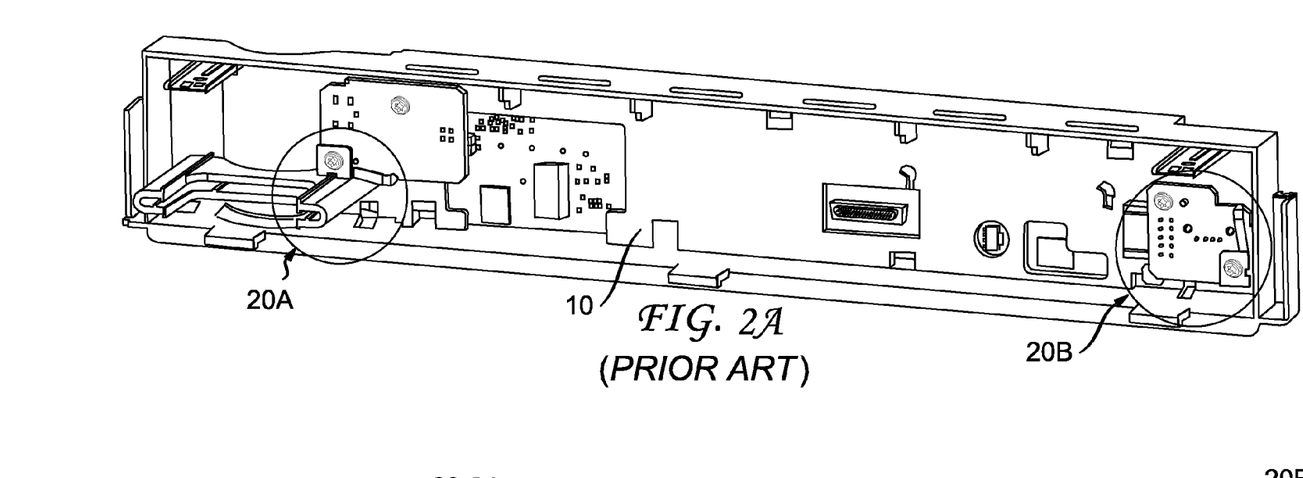
FIGS. 2A-2c show an example of a cantilever ground connection between a frame to an internal PCB, according to the prior art.
Figure 2B:
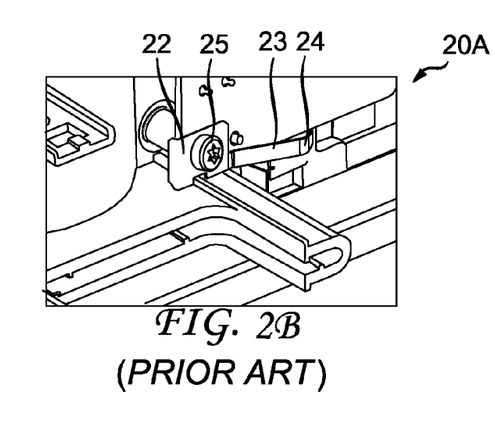
Figure 2C:
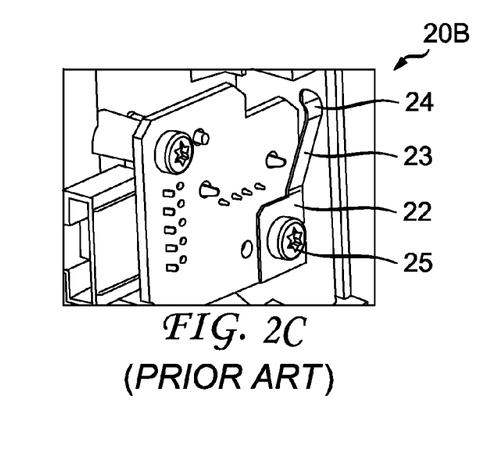

FIGS. 2A-2C show one example of a USB and RESET GROUND to Frame connection 20A and 20B according to the prior art. In this example, the ground connector 20 is of a cantilever design and includes a base attachment 22, a cantilever arm 23 extending from the base attachment, and a contact point 24 at the end of cantilever arm 23. A base attachment screw 25 or the like secures the ground connector 20 to the PCB for the USB and RESET GROUND, respectively. In this configuration, the cantilevered ground connector 20 is configured such that it applies a low force to the bezel graphic assembly being attached thereto, which low force allows for aggressive preload to make sure of contact when assembled.

In this configuration the ground connector 20 fits both PCBs and can reduce manufacturing costs by eliminating the need for multiple different ground connectors.

Figure 3A:
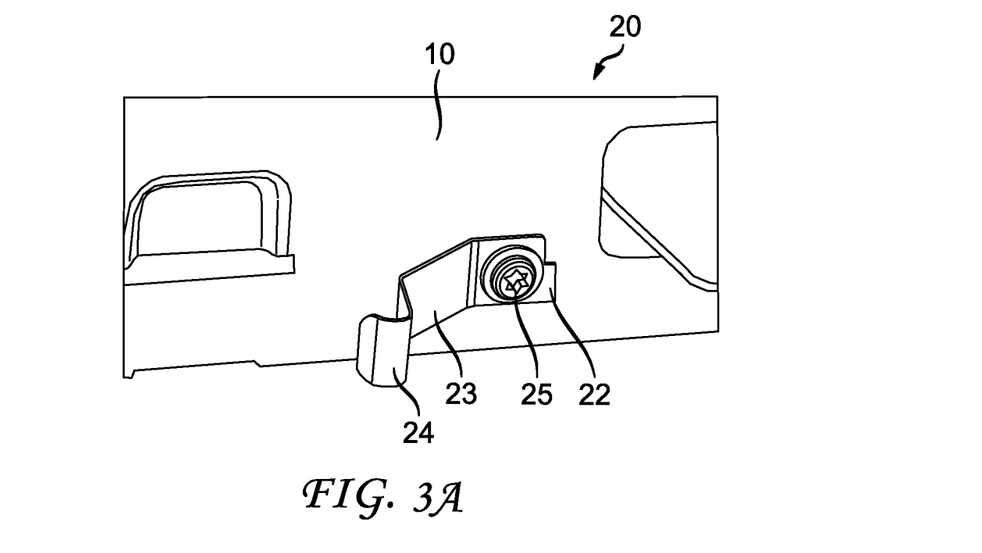
FIGS. 3A and 3B show another example of a cantilever ground connection between a frame and an internal PCB, according to the prior art.
Figure 3B:
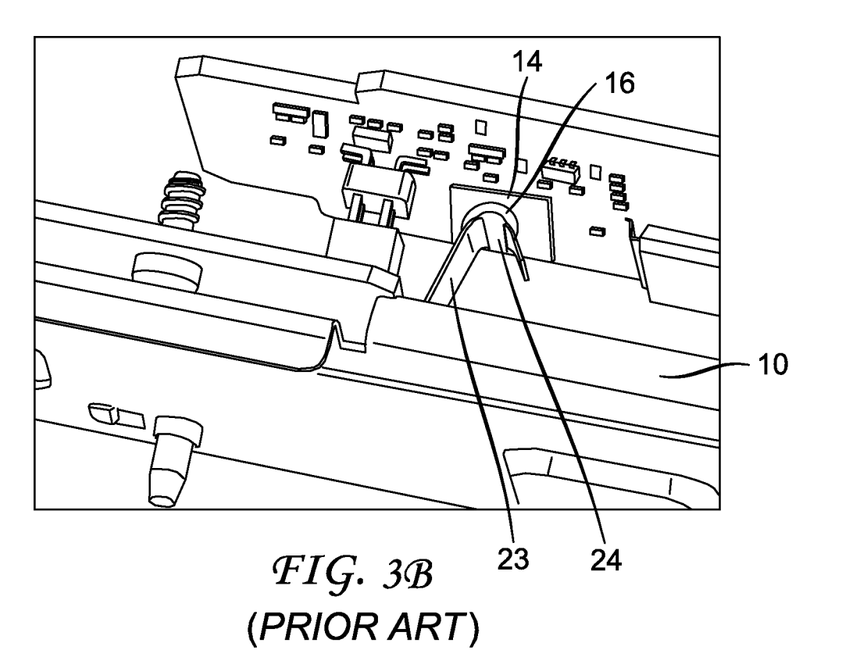

FIGS. 3A and 3B show the ground connector 20 according to an implementation. As shown, the ground connector 20 is attached to the front frame wall 20 via base attachment 22 and corresponding base attachment screw 25. When the front frame wall is assembled with the front frame assembly or graphic bezel (not shown) the contact point 24 engages the ground contact 16 on the printed circuit board 14 which is part of the front frame or graphic bezel assembly. One drawback to the above implementation is that the ground connection is still a "blind" connection in that the user cannot visually observe the contact between contact point 24 and ground contact 16, and must assume the ground contact is made when the front frame wall 10 is aligned with the front frame or graphic bezel assembly and the parts fit together as intended. Another drawback is that the arm 23 or contact point 24 of the ground connector 20 may get bent during assembly, and since the installation is a blind one, it will be difficult to identify and/or remedy such problem.

Figure 4A:
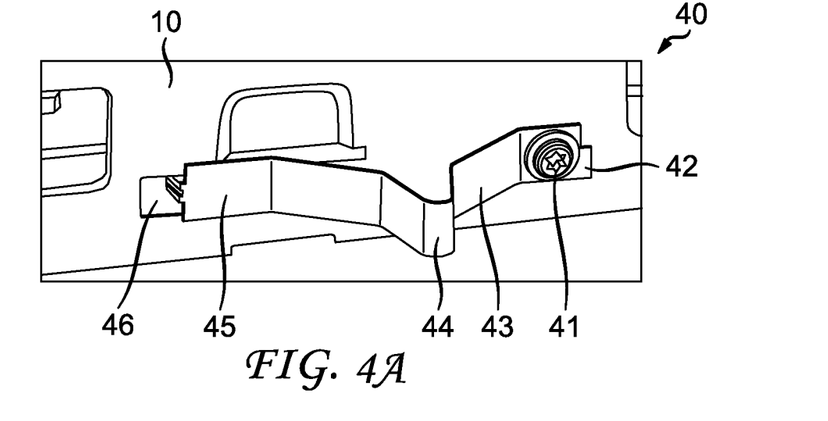
FIGS. 4A-4C show a ground connector including a visual indicator according to an implementation of the present principles.
Figure 4B:
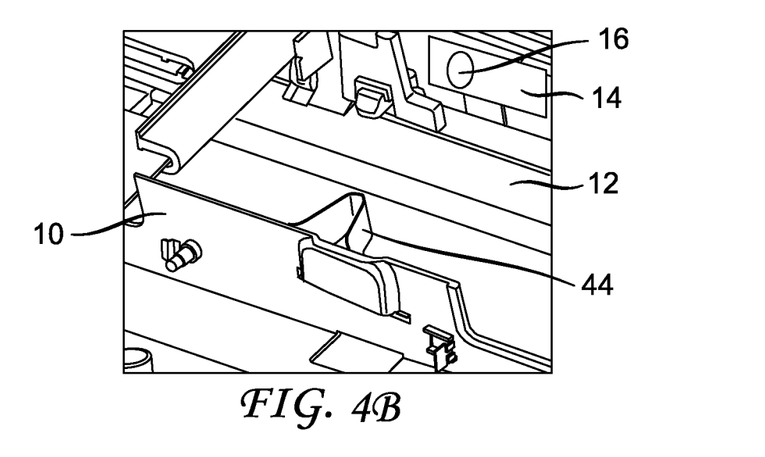
Figure 4C:
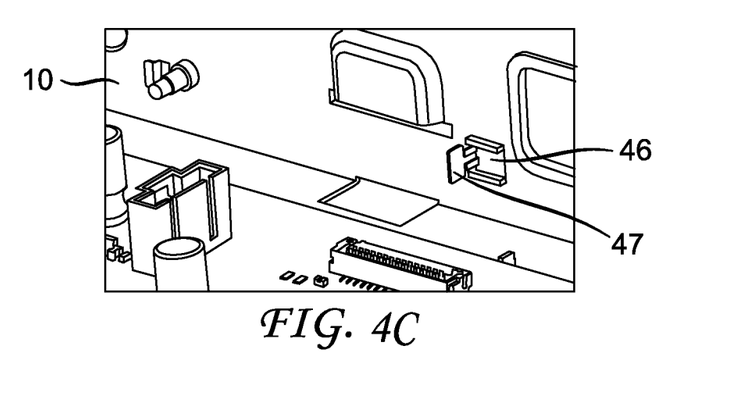

Referring to FIGS. 4A-4C, there is shown a detachable ground connector or clip 40 in accordance with a preferred implementation of the present principles. The ground clip includes a protruding flexible arm configured to contact the ground contact of a PCB. In this implementation the ground clip 40 also includes a visual indicator means on an opposite side (i.e., interior side) of the front frame wall 10 on which it is mounted and which provides a visual confirmation to the assembler that the ground connection between the front frame wall 10 and the PCB 14 of the FPA 12 has been made and is proper.

The ground connector/clip 40 has a base attachment 42 attached to the frame wall 10 via base attachment screw 42 or the like. The protruding flexible arm of the ground clip 40 is made up of a proximal portion 43 extending from the base attachment 42 and at its end has an outermost point that is curved and operates as the central contact point 44. A distal portion 45, connected to the contact point 44 is configured to move along the front frame wall 10 when the central contact 44 is depressed inward.

A slot or opening 46 in the frame wall 10 receives a tab like indicator 47, which as shown in FIGS. 4A-4C, is positioned such that there remains a visually observable opening through slot 46 (from an interior side of frame wall 10). In this position, it can be determined from the side of frame wall 10 opposite ground connector 40, that the central contact point 44 has not been engaged with a corresponding ground contact on the PCB. Those of skill in the art will appreciate that the shape of indicator 47 may change without departing from the intended scope of this disclosure. For example, indicator 47 is shown in the form of a tab, which is slightly larger than the slot 46. In this configuration, the tab 47 is prevented from accidentally coming out of the slot 46. According to this configuration, the central contact point 44 is biased outward as shown, such that upon depression of the same, the visual indicator at the distal end moves when pressure against the outward bias is present (resulting from the engagement with the ground contact of the PCB).

Figure 5A:
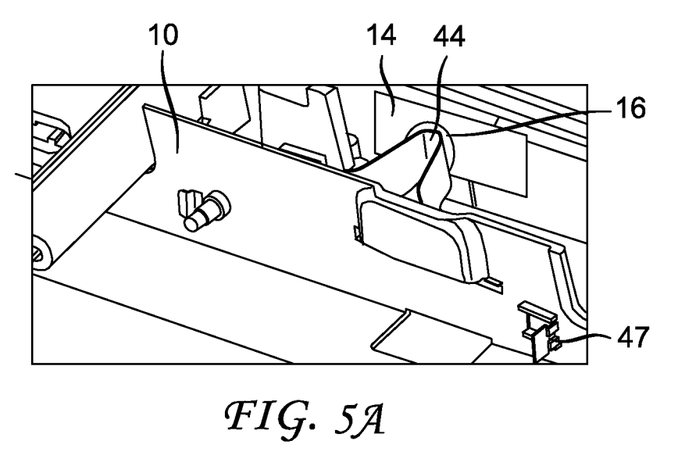
FIGS. 5A and 5B show the ground connector of FIG. 4 in the engaged mode of operation, according to an implementation of the present principles.
Figure 5B:
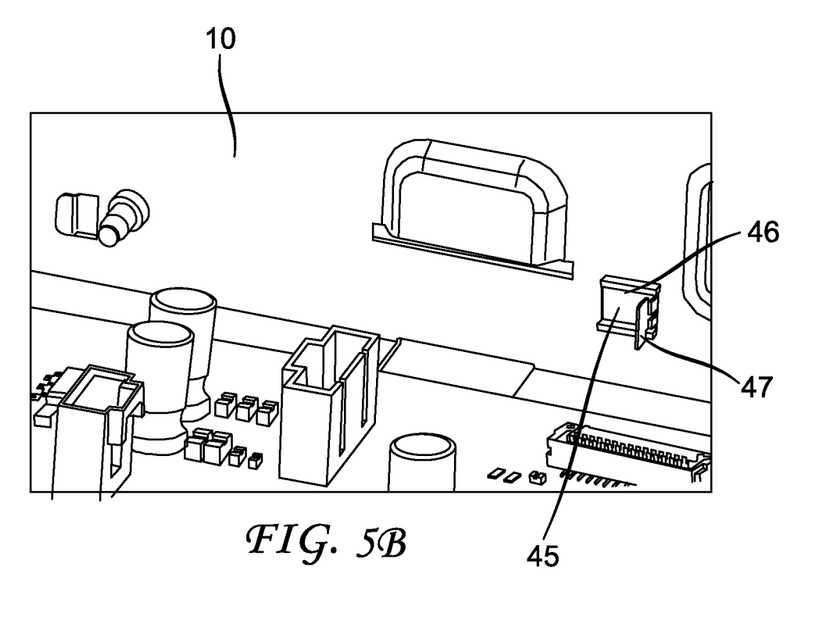

Referring to FIGS. 5A and 5B, the ground clip 40 is shown in the engaged position where central contact point 44 is engaged with the ground contact 16 on the PCB 14 of a front panel assembly (FPA) or bezel graphic assembly. As shown, when the central contact point 44 engages the ground contact 16, it causes the displacement of distal end 45 (along front wall 10) and thereby movement of the indicator 47 across the slot 46 so as to fill the slot. As shown, the back side of portion 45 can be seen on the opposite side of the frame wall 10, with indicator 47 now disposed all the way to the right of the slot 46. The position of indicator 47 as shown provides a visual indication that the central contact 44 has engaged the ground contact 16 with the appropriate force so as to provide the required ground connection between the front frame wall and the PCB of the FPA or bezel graphic assembly. In this manner, the assembler can now visually confirm the proper ground to FPA or bezel graphic assembly connection.

Figure 6A:
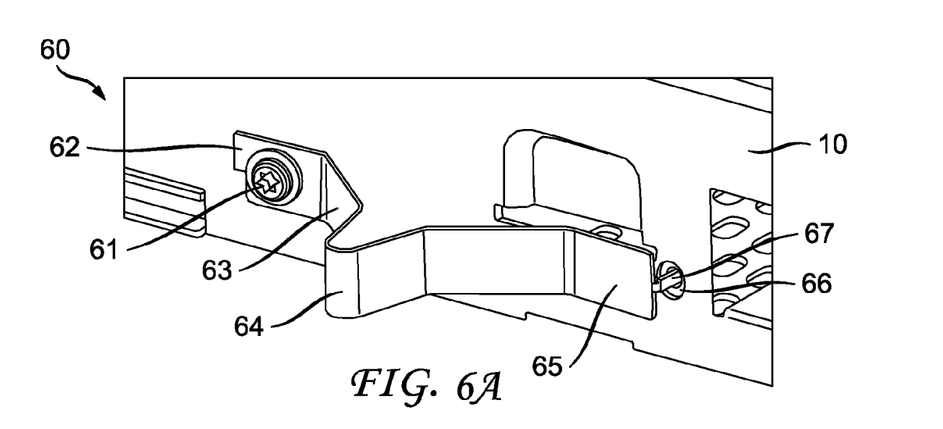
FIGS. 6A-6C show a ground connection including a visual indicator according to another implementation of the present principles.
Figure 6B:
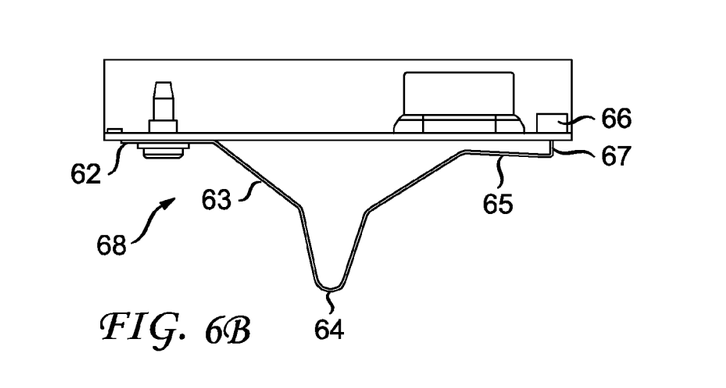
Figure 6C:
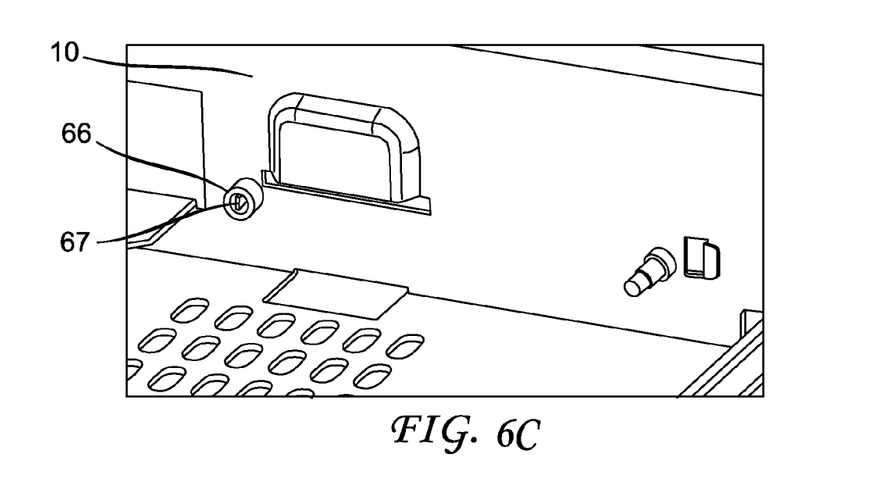

FIGS. 6A-6C show another implementation of the ground clip 60 according to the present principles. In this implementation, the ground clip 60 includes the base attachment portion 62, secured to the frame wall 10 via attachment screw 61. The proximate portion 63 ends at the central ground contact 64. In this implementation, a different visual indicator means is provided. Here, the distal portion 65 includes a pin 67 that rests within a hole 66 in the frame wall 10. As shown in FIGS. 6A, 6B and 6C, when central ground contact 64 is not engaged, the distal portion 65 is slightly spaced away from the frame front wall 10, and the pin 67 does not protrude through to the other side of the hole 66 (See FIG. 6B). Thus, upon engagement at the central point of contact 64, the clip will bend at point 68 causing pin 67 to move transverse to front wall 10 and full engage or mate with hole 66.

Figure 7A:
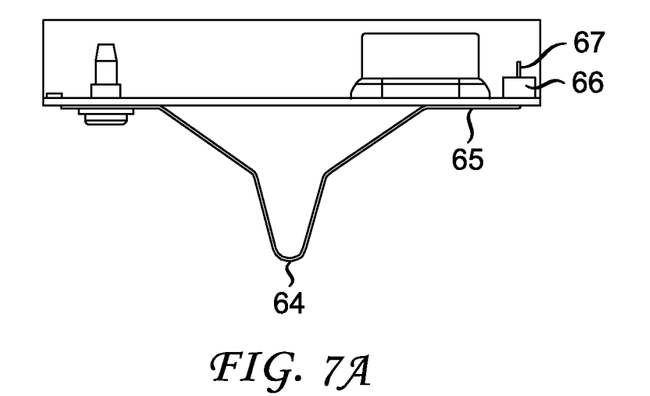
FIGS. 7A and 7B show the ground connector of FIG. 6 in the engaged mode of operation, according to an implementation of the present principles.
Figure 7B:
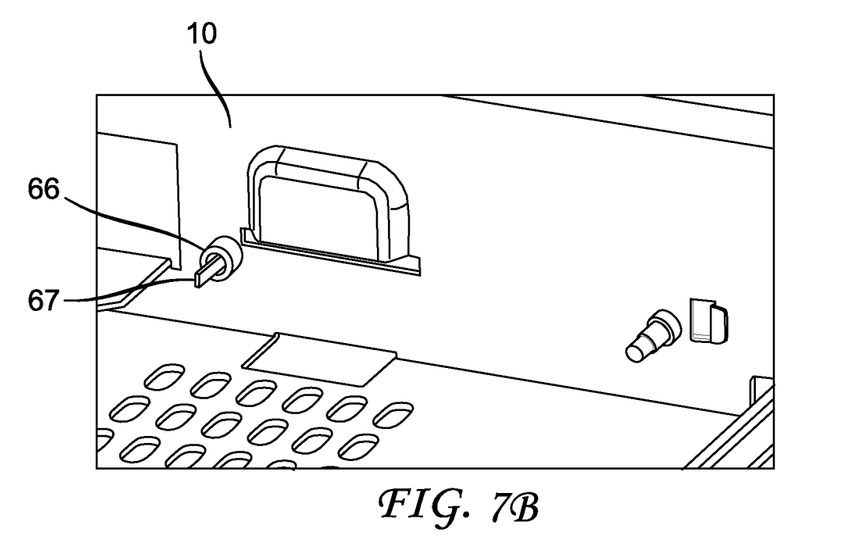

FIGS. 7a and 7B show the example of when ground clip 60 is engaged at the central contact 64 such that the distal portion 65 is now flush up against the frame wall 10, and pin 67 is fully mated with and includes a portion that protrudes through hole 66 such that an end of the same is visible on the opposite side of front frame wall 10. Thus, the protrusion of pin 67 through opening 66 operates to provide the visual indication that the ground connector 60 has engaged its corresponding point of contact on the PCB of the associated frame panel assembly (FPA) or bezel graphic assembly.

These and other features and advantages of the present principles may be readily ascertained by one of ordinary skill in the pertinent art based on the teachings herein.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. A ground connection for an electronic device comprising:
   a ground connector clip connected to a front frame wall of the electronic device and having a protruding flexible arm configured to engage a ground contact of a printed circuit board that is part of a front panel assembly; and
   a visual indicator integrated into the ground connector clip and the front frame wall and being configured to provide a visual indication of a proper ground connection between the protruding flexible arm and the ground contact of the printed circuit board when the front panel assembly is finally aligned with the front frame wall for assembly, the visual indicator includes:
   an aperture in the front frame wall of the electronic device; and
   a part of the distal end portion configured to fit into the aperture in the front frame wall;
   wherein said part of the distal end portion is observable from an interior side of the front frame to indicate whether the central contact has sufficiently contacted the ground contact of the printed circuit board.

2. The ground connection for an electronic device as recited in claim 1, wherein the protruding flexible arm comprises:
   an attachment base configured to be secured to the front frame wall via an attachment screw;
   a proximal portion extending from the attachment base;
   a central contact portion connected to the proximal portion and being the portion of the flexible arm configured to contact the ground contact on the printed circuit board; and
   a distal end portion connected to the central contact portion.

3. The ground connection for an electronic device as recited in claim 1, wherein said aperture comprises a slot, and said part of the distal end comprises a tab, wherein the position of the tab within the slot provides the visual indication of sufficient or insufficient contact between the central contact and the printed circuit board.

4. The ground connection for an electronic device as recited in claim 1, wherein said aperture comprises a circular hole, and said part of the distal end comprises a pin partially disposed in said circular hole,
   wherein said pin is not visible from the interior side of the frame wall when either no contact or insufficient contact between the central contact and the ground contact of the printed circuit board exists, and
   wherein upon sufficient contact of the central contact with the ground contact of the printed circuit board, said pin becomes visible through said hole from the interior side of the frame wall, thereby visually indicating proper ground connection.

5. The ground connection for an electronic device as recited in claim 2, wherein said central contact is configured to be outwardly biased, wherein force against the outward bias results in movement of the visual indicator means.

6. A set top box comprising:
   a frame having a front frame wall and a front panel assembly, wherein the front frame wall is grounded and is disposed substantially parallel to the front panel assembly;
   the front panel assembly having a printed circuit board on an interior side of the front panel assembly, the printed circuit board having a ground contact;
   a detachable ground clip attached to the front frame and having a protruding flexible arm that contacts the ground contact of the printed circuit board when the front wall assembly is finally positioned relative to the front panel assembly;
   the flexible arm having an attachment base from which the flexible arm extends;
   the front wall having an aperture;
   the flexible arm having a proximal portion extending from the attachment base;
   a central contact portion of the flexible arm connected to the proximal portion, the central contact portion including that portion of the flexible arm that contacts the ground contact on the printed circuit board; and,
   a visual indicator integrated into the detachable ground clip and the front frame wall and being configured to provide a visual indication of a proper ground connection between the central contact portion and the ground contact of the printed circuit board when the front panel assembly is aligned with the front frame wall for assembly, wherein the visual indicator includes:
   a distal end portion of the flexible arm connected to the central contact portion; and
   a part of the distal end portion configured to extend through the aperture in the front wall;
   wherein the extent of an electrically conductive engagement between the central contact portion and the ground contact is visually observed from an interior side of the front frame wall.

7. The set top box as recited in claim 6, wherein said aperture comprises a slot and the part of the distal end portion comprises a tab.

8. The set top box as recited in claim 6, wherein said aperture comprises a circular hole and the part of the distal end portion comprises a pin;
- wherein said pin is not visible from the interior side of the frame wall when either no contact or insufficient contact between the central contact and the ground contact of the printed circuit board exists, and
- wherein upon sufficient contact of the central contact with the ground contact of the printed circuit board, said pin becomes visible through said hole from the interior side of the frame wall, thereby visually indicating proper ground connection.

* * * * *